(12) United States Patent
Odnoblyudov et al.

(10) Patent No.: US 10,510,577 B2
(45) Date of Patent: Dec. 17, 2019

(54) LIFT OFF PROCESS FOR CHIP SCALE PACKAGE SOLID STATE DEVICES ON ENGINEERED SUBSTRATE

(71) Applicant: QROMIS, Inc., Santa Clara, CA (US)

(72) Inventors: Vladimir Odnoblyudov, Danville, CA (US); Cem Basceri, Los Gatos, CA (US)

(73) Assignee: Qromis, Inc., Santa Clara, CA (US)

( * ) Notice: Subject to any disclaimer, the term of this patent is extended or adjusted under 35 U.S.C. 154(b) by 0 days.

(21) Appl. No.: 15/974,606

(22) Filed: May 8, 2018

(65) Prior Publication Data

US 2018/0261488 A1    Sep. 13, 2018

Related U.S. Application Data

(63) Continuation of application No. 15/288,506, filed on Oct. 7, 2016, now Pat. No. 9,997,391.
(Continued)

(51) Int. Cl.
*H01L 21/683* (2006.01)
*H01L 33/00* (2010.01)
(Continued)

(52) U.S. Cl.
CPC .... *H01L 21/6835* (2013.01); *H01L 21/76251* (2013.01); *H01L 33/00* (2013.01);
(Continued)

(58) Field of Classification Search
CPC ............. H01L 33/0079; H01L 21/6835; H01L 21/7813
See application file for complete search history.

(56) References Cited

U.S. PATENT DOCUMENTS

2003/0157783 A1   8/2003  Fonash et al.
2006/0255341 A1   11/2006 Pinnington et al.
(Continued)

FOREIGN PATENT DOCUMENTS

TW      201725604     7/2017
WO      2017069962    4/2017

OTHER PUBLICATIONS

U.S. Appl. No. 15/288,506 , "Non-Final Office Action", dated Sep. 11, 2017, 14 pages.
(Continued)

*Primary Examiner* — Selim U Ahmed
*Assistant Examiner* — Evan G Clinton
(74) *Attorney, Agent, or Firm* — Kilpatrick Townsend & Stockton LLP

(57) ABSTRACT

A method of processing an engineered substrate structure includes providing an engineered substrate structure including a polycrystalline substrate and an engineered layer encapsulating the polycrystalline substrate, forming a sacrificial layer coupled to the engineered layer, joining a solid state device structure to the sacrificial layer, forming one or more channels in the solid state device structure by removing one or more portions of the solid state device structure to expose one or more portions of the sacrificial layer, flowing an etching chemical through the one or more channels to the one or more exposed portions of the sacrificial layer, and dissolving the sacrificial layer by interaction between the etching chemical and the sacrificial layer, thereby separating the engineered substrate structure from the solid state device structure.

18 Claims, 11 Drawing Sheets

Related U.S. Application Data

(60) Provisional application No. 62/243,540, filed on Oct. 19, 2015.

(51) Int. Cl.
  *H01L 33/38* (2010.01)
  *H01L 21/762* (2006.01)
  *H01L 21/78* (2006.01)
  *H01L 33/08* (2010.01)
  *H01L 33/20* (2010.01)
  *H01L 33/50* (2010.01)

(52) U.S. Cl.
  CPC ........ *H01L 33/382* (2013.01); *H01L 21/7813* (2013.01); *H01L 33/08* (2013.01); *H01L 33/20* (2013.01); *H01L 33/50* (2013.01); *H01L 2221/6835* (2013.01); *H01L 2221/68381* (2013.01)

(56) References Cited

U.S. PATENT DOCUMENTS

| | | |
|---|---|---|
| 2009/0278161 A1 | 11/2009 | Lee et al. |
| 2010/0317132 A1 | 12/2010 | Rogers et al. |
| 2013/0049043 A1 | 2/2013 | Schubert et al. |
| 2014/0183442 A1 | 7/2014 | Odnoblyudov et al. |
| 2014/0308819 A1 | 10/2014 | Enokido et al. |
| 2015/0090956 A1 | 4/2015 | Coones et al. |
| 2015/0229108 A1* | 8/2015 | Steigerwald .......... H01S 5/4093 372/45.01 |
| 2017/0110314 A1 | 4/2017 | Odnoblyudov et al. |

OTHER PUBLICATIONS

U.S. Appl. No. 15/288,506 , "Notice of Allowance", dated Feb. 26, 2018, 8 pages.

PCT/US2016/056271 , "International Search Report and Written Opinion", dated Dec. 22, 2016, 9 pages.

\* cited by examiner

LIFT OFF PROCESS FOR CHIP SCALE PACKAGE SOLID STATE DEVICES ON ENGINEERED SUBSTRATE

CROSS-REFERENCES TO RELATED APPLICATIONS

This application is continuation application of U.S. patent application Ser. No. 15/288,506, filed on Oct. 7, 2016, which claims the benefit of U.S. Provisional Patent Application No. 62/243,540, filed on Oct. 19, 2015, the contents of which are incorporated by reference in their entirety.

BACKGROUND OF THE INVENTION

Wide band gap (WBG) semiconductor devices are expensive and time consuming to manufacture. For example, gallium nitride (GaN) materials are formed by a heteroepitaxial (epi) growth process that involves depositing GaN on a semiconductor carrier substrate having a different lattice structure (or lattice constant) than the deposited GaN. The lattice mismatch between the GaN and the carrier substrate may create defects, dislocations, and strains that may negatively impact device yields and performance. In addition, the GaN layers and carrier substrate may have different coefficients of thermal expansion (CTE). Thermal processing (e.g. GaN epitaxial growth) can crack or delaminate the GaN or bow, and in some cases break, the carrier substrate. The different CTEs may restrict substrate wafer size limiting scale and preventing reduction of the overall manufacturing cost of WBG devices and solutions.

SUMMARY OF THE INVENTION

The present invention relates generally to lift off processes for chip scale package solid state devices formed on engineered substrates. More specifically, the present invention relates to methods and systems suitable for fabricating solid state devices using epitaxial growth processes. As described herein, some embodiments of the present invention have been applied to methods and systems for fabricating solid state devices on an engineered substrate structure by epitaxial growth, wherein the engineered substrate structure is characterized by a coefficient of thermal expansion (CTE) that is substantially matched to epitaxial layers that form the solid state devices. Some embodiments of the present invention include methods for separating the engineered substrate structure from the solid state devices after the devices have been formed. The separated engineered substrate can be reused later for fabricating more devices, which would save cost of fabricating the devices. The methods and techniques can be applied to a variety of semiconductor processing operations.

According to an embodiment of the present invention, a method of processing an engineered substrate structure includes providing an engineered substrate structure. The engineered substrate may include a polycrystalline substrate and an engineered layer encapsulating the polycrystalline substrate. The method further includes forming a sacrificial layer coupled to the engineered layer, and joining a solid state device structure to the sacrificial layer. The method further includes forming one or more channels in the solid state device structure by removing one or more portions of the solid state device structure to expose one or more portions of the sacrificial layer, flowing an etching chemical through the one or more channels to the one or more exposed portions of the sacrificial layer, and dissolving the sacrificial layer by interaction between the etching chemical and the sacrificial layer, thereby separating the engineered substrate structure from the solid state device structure.

According to another embodiment of the present invention, a method of processing an engineered substrate structure includes providing an engineered substrate structure. The engineered substrate structure may include a polycrystalline substrate, and an engineered layer encapsulating the polycrystalline substrate. The method further includes forming a sacrificial layer coupled to the engineered layer. The sacrificial layer has an exposed periphery. The method further includes joining a solid state device structure to the sacrificial layer, applying an etching chemical to the exposed periphery of the sacrificial layer, and dissolving the sacrificial layer by interaction between the etching chemical and the sacrificial layer, thereby separating the engineered substrate structure from the solid state device structure.

According to a further embodiment of the present invention, a method of processing an engineered substrate structure includes providing an engineered substrate structure. The engineered substrate structure may include a polycrystalline substrate, and an engineered layer encapsulating the polycrystalline substrate. The engineered layer has an exposed periphery. The method further includes joining a solid state device structure to the engineered layer, applying an etching chemical to the exposed periphery of the engineered layer, and dissolving the engineered layer by interaction between the etching chemical and the engineered layer, thereby separating the polycrystalline substrate from the solid state device structure.

Numerous benefits are achieved by way of the present invention over conventional techniques. For example, embodiments of the present invention provide solid state devices, such as solid state emitters, formed on engineered substrates that have a coefficient of thermal expansion (CTE) that is substantially matched to the CTE of the epitaxial layers of the devices. Matching the thermal expansion properties of the growth substrate to the epitaxial layer reduces the stress in the epitaxial layers and/or the engineered substrate. Stress is responsible for several types of defects. For example, stress may increase dislocation density in the epitaxial layer, which impairs electrical and optical properties of the epitaxial layer. Stress may also lead to residual strain in the epitaxial layer or the substrate, which may lead to additional processing concern in later steps, such as stress cracking, dislocation glide, slip, bow and warp. Thermal expansion induced bow and warp of the substrate may make handling of the material problematic in automated equipment, and limit the ability to perform additional lithographic steps necessary for device fabrication. In addition, the device performance lifetime is reduced in stressed materials. Stress relaxation and stress-induced crack propagation, dislocation glide, and other lattice movement resulting from thermal mismatch may lead to early failures in a range of modes, from reduced device performance to fracture or peeling of devices and device layers. Embodiments of the present invention provide methods and techniques for separating an engineered substrate from the epitaxial layers of the devices without destroying the engineered substrate. The separated engineered substrate can be reused later for fabricating more devices, which would save cost of fabricating the devices.

These and other embodiments of the invention along with many of its advantages and features are described in more detail in conjunction with the text below and attached figures.

BRIEF DESCRIPTION OF SPECIFIC EMBODIMENTS

DETAILED DESCRIPTION OF THE INVENTION

The present invention relates generally to lift off processes for chip scale package solid state devices formed on engineered substrates. More specifically, the present invention relates to methods and systems suitable for fabricating solid state devices using epitaxial growth processes. As described herein, some embodiments of the present invention have been applied to methods and systems for fabricating solid state devices on an engineered substrate structure by epitaxial growth, wherein the engineered substrate structure is characterized by a coefficient of thermal expansion (CTE) that is substantially matched to epitaxial layers that form the solid state devices. Some embodiments of the present invention include methods for separating the engineered substrate structure from the solid state devices after the devices have been formed. The separated engineered substrate may be reused later for fabricating more devices. The methods and techniques can be applied to a variety of semiconductor processing operations.

Figure 1:
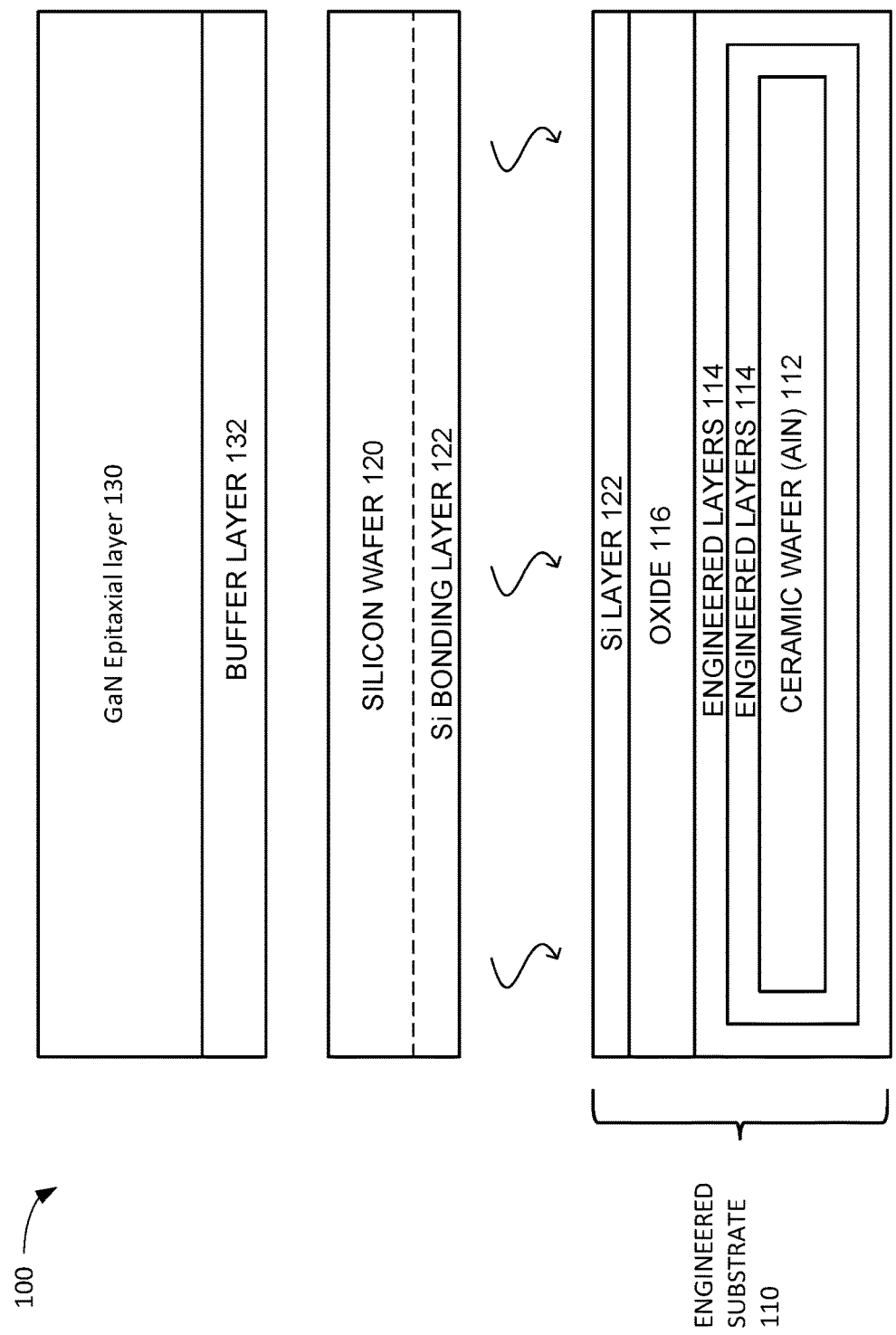
FIG. 1 shows a GaN epitaxial layer formed on an engineered substrate.

FIG. 1 shows a GaN epitaxial layer 130 formed on an engineered substrate (ES) 110. Manufacturing of engineered substrate 110 begins with a ceramic polycrystalline wafer 112, such as aluminum nitride (AlN). Wafer 112 may comprise other polycrystalline materials, such as silicon carbide (SiC), or gallium nitride (GaN), aluminum gallium nitride (AlGaN).

A series of engineered layers 114 are deposited onto ceramic wafer 102, such as layers of oxide, nitride, and polysilicon. Engineered layers 114 provide adhesion, defectively management, and a diffusion barrier for subsequent GaN epitaxial layers. An additional oxide layer 116 may be deposited on one side of ceramic wafer 112. A portion of oxide layer 116 is polished back with a chemical mechanical planarization (CMP) process to create a smooth surface for subsequent wafer bonding.

A layer transfer process is performed using a silicon wafer 120. Silicon wafer 120 is implanted with several elements to create a damage interface inside Si, which helps to form bonding layer 122 for attaching to oxide layer 116. Applying pressure atomically bonds silicon wafer 120 to oxide layer 116. After the bonding process, an exfoliation process activates the damage interface inside Si wafer, causing the implanted elements in bonding layer 122 to expand splitting off the top portion of silicon wafer 120 onto ceramic wafer 112 with engineered layers 114. Remaining silicon layer 122 bonded to oxide layer 116 is relatively thin at around less than 5 microns and therefore does not significantly contribute to the CTE properties of engineered substrate 110. CTE properties of engineered substrate 110 are therefore determined by CTE coefficients of ceramic wafer 112.

GaN epitaxial layer 130 (which can be referred to as epi layer), can be formed by epitaxially growing a number of layers or sub-layers to form an epitaxial structure on top of engineered substrate 110. Thus the term layer should be understood to include a structure including multiple layers or sub-layers of the same or different materials. Ceramic wafer 112 and epitaxial layer 130 are substantially CTE matched. This CTE matching enable formation of thicker, higher quality epitaxial layers on larger sized ceramic wafers 112 without cracking or warping. For example, epitaxial layer 130 may be formed on 6 inch, 8 inch, 12 inch, or larger sized Engineered Substrates 110. Fabrication of larger wafers increases device count per wafer resulting in less expensive GaN device fabrication.

CTE matching also enables formation of a significantly thicker epitaxial layer (tens or hundreds of microns) on top of engineered substrate 110. The thicker combination of epitaxial layers may reduce the overall dislocation density for the lattice structures between epitaxial layer 130 and silicon layer 122. In additional, a larger number of epitaxial layers can be used to support more complex circuitry for a wider array of GaN applications.

Light Emitting Diode (LED) Architectures

Figure 2:
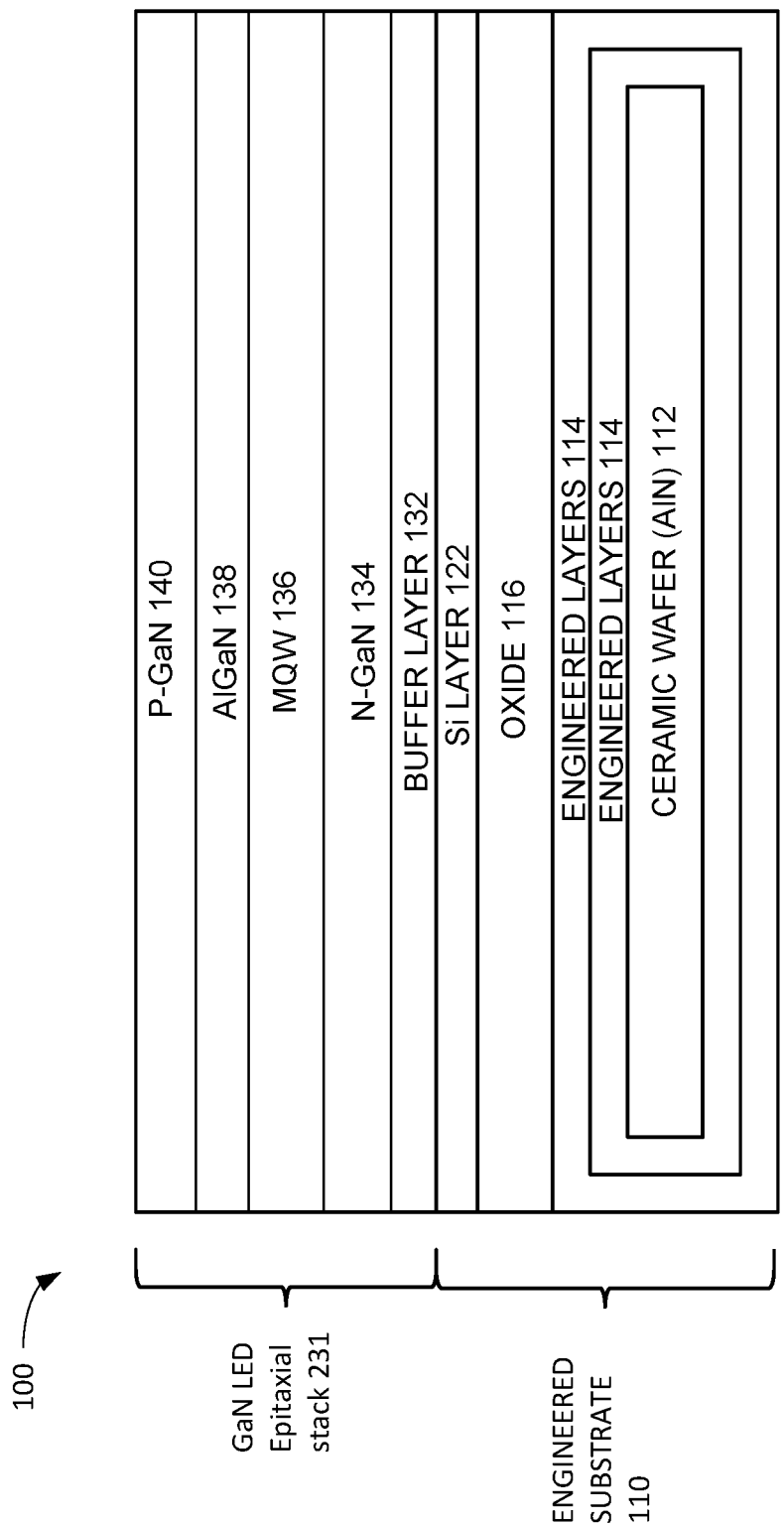
FIG. 2 shows a GaN light emitting diode (LED) epitaxial stack formed on an engineered substrate.

FIG. 2 shows a GaN LED epitaxial stack 231 already formed on engineered substrate (ES) 110. Although an LED epitaxial stack suitable for emission of light is illustrated in FIG. 2 and other figures herein, embodiments of the present invention are not limited to LED implementations and other device structures, including p-n diodes, Schottky diodes, transistors, HEMTs, RF devices, hybrid or integrated devices, and the like, in lateral or vertical architectures, are included within the scope of the present invention. Thus, one of skill in the art will be able to substitute other electronic structures for the LED structure illustrated in FIG. 2 and other figures herein. One of ordinary skill in the art would recognize many variations, modifications, and alternatives.

Various architectures are used for forming WBG light emitting diodes (LEDs). For example, lateral or flip chip architectures may use a transparent substrate, such as sapphire or SiC, to form LED devices. Vertical architecture may use an absorbing substrate such as silicon, which is removed during device fabrication, to form LED devices.

A typical LED GaN epitaxial stack 231 may include an n-type GaN layer 134 formed on top of buffer layer 132. An active region with multiple layers of GaN and indium gallium nitride (InGaN) forms multiple quantum well (MQW) active region 136. An aluminum gallium nitride (AlGaN) current blocking layer 138 may be applied on MQW region 136 and a p-type GaN layer 140 is applied on AlGaN layer 138. Applying a voltage across n and p GaN layers 134 and 140, respectively, inject carriers into MQW region 136 causing light emission.

Of course this is just one example engineered substrate 110 and just one example GaN LED epitaxial stack or structure formed on top of engineered substrate 110. Other example engineered substrates and other epitaxial structures are described in the following U.S. patents which are herein all incorporated by reference in their entirety, U.S. Pat. Nos. 7,358,152; 7,535,100; 6,593,212; 6,497,763; 6,328,796; 6,323,108; U.S. Ser. No. 12/836,970; U.S. Ser. No. 13/732,739; U.S. Ser. No. 13/223,162; U.S. Ser. No. 13/732,934; U.S. Ser. No. 12/969,302; U.S. Ser. No. 12/836,970; U.S. Pat. Nos. 8,436,362; 8,729,563; and U.S. Ser. No. 14/282,406.

Figure 3:
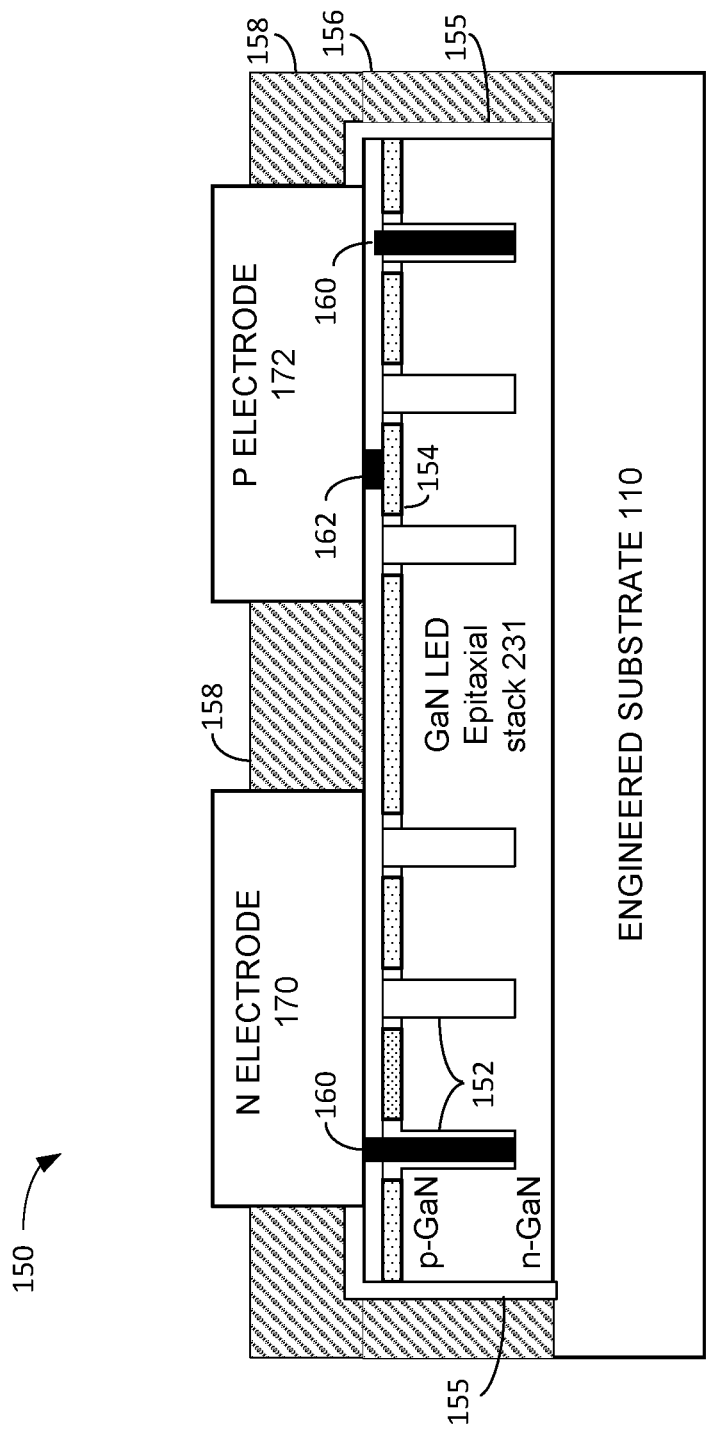
FIG. 3 shows a chip scale package (CSP) solid state light emitting diode (LED) device formed on the engineered substrate.

FIG. 3 shows in more detail a side cross-sectional view of an example LED device 150 that includes GaN LED epitaxial stack 231 formed on engineered substrate 110. Mesas 152 are etched down to the n-GaN layer of GaN LED epitaxial stack 231. Sidewalls of mesas 155 are covered with dielectric material, to provide electrical isolation. Buried n-contacts 160 connect the n-GaN layer via routing layers 156 to n-electrode 170. Reflective p-contacts 154 are formed on the p-GaN layer of GaN LED epitaxial stack 231 and connect via routing layers 156 to a p-electrode 172. Electrodes 170 and 172 are built up in height with copper plating to around 50-100 μm.

A molding material 158 is applied around electrodes 170 and 172, such as an epoxy, epoxy molding compound (EMC), or sheet molding compound (SMC). The epoxy is initially viscous and dispensed around electrodes 170 and 172. The epoxy 158 is then heated and pressed until solidifying into solid structural support around electrodes 170 and 172.

A polishing process is typically used for grinding engineered substrate 110 off of GaN LED epitaxial stack 231. However, the grinding process takes a substantial amount of time and destroys ES 110. The cost of fabricating LED device 150 increases since new ES 110 is needed for each wafer. The grinding process also applies stress to GaN LED epitaxial stack 231.

Figure 4:
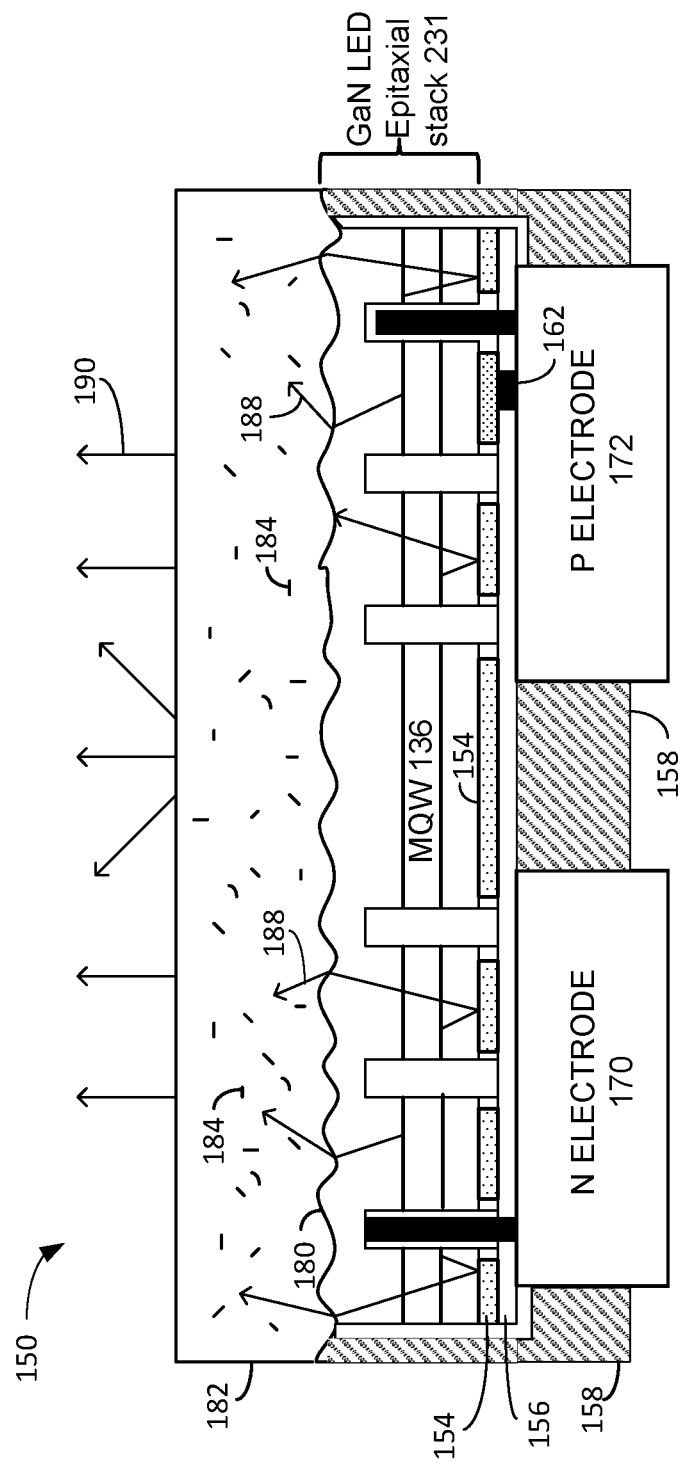
FIG. 4 shows the CSP device of FIG. 3 after removal of the engineered substrate, and subsequent processing steps.

FIG. 4 shows next process steps after engineered substrate 110 is removed and LED device 150 inverted. An upper surface 180 of GaN LED epitaxial stack 231 is roughened to increase light extraction. A layer of transparent silicone 182 is applied on top of GaN LED epitaxial stack 231 and hardened for additional structural support. Silicone 182 may contain a phosphorous material 184.

Voltage is applied across electrodes 172 and 170 exciting electrons in MQW region 136 and generating a blue light 188. Blue light 188 exits either directly into silicone 182 or reflects back off of mirrored p-contacts 154 into silicone layer 182. Blue light 188 excites phosphorus 184 in silicone layer 182 converting into a yellow light that outputs from LED device 150 as white light 190.

Non-Destructive Substrate Removal

Figure 5:
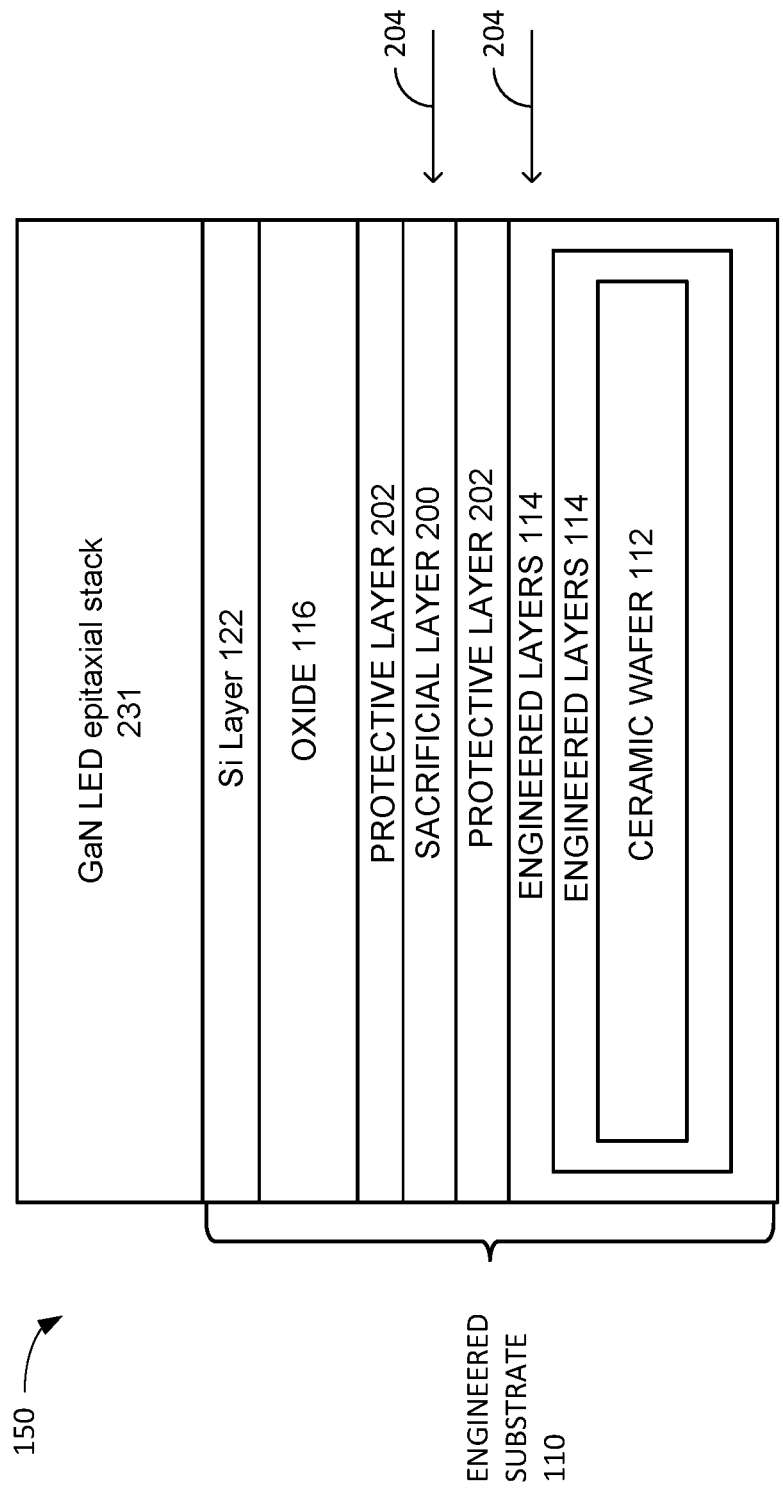
FIG. 5 shows a sacrificial layer formed in an engineered substrate.

FIG. 5 shows a technique for separating engineered substrate 110 from GaN LED epitaxial stack 231 without destroying ES 110. Engineered substrate 110 may include multiple engineered layers including nitride layers 114 and oxide layer 116. In one example, a chemical 204, such as hydrofluoric acid (HF), is infused into the lateral sides of the wafer retaining LED device 150 to etch out one or more engineered layers 114 while AlN wafer 112 and GaN LED epitaxial stack 231 remain intact. Etching one of engineered layers 114 separates GaN LED epitaxial stack 231 from the remainder of ES 110 while preserving ceramic wafer AlN 112 for reuse. This chemical lift off process also reduces overall stress on LED device 150 by eliminating the previous polishing process.

In a second example, a sacrificial layer 200 is formed on or between any of engineered layers 114 and/or 116. In one example, sacrificial layer 200 comprises a metal or some other substance susceptible to disintegration by chemical 204. For example, sacrificial layer 200 may use a metal such as titanium (Ti) that is highly susceptible to dissolving when exposed to HF. In some embodiments, the sacrificial layer 200 may comprise one of titanium (Ti), vanadium (V), chromium (Cr), tantalum (Ta), tungsten (W), rhenium (Re), silicon oxide, silicon nitride, silicon oxinitride, or a combination thereof. Chemical 204 etches out sacrificial layer 200 without damaging engineered substrate 110 or GaN LED epitaxial stack 231. The use of sacrificial layer 200 may further reduce the amount of time required to detach engineered substrate 110 from GaN LED epitaxial stack 231.

In another example, protective layers 202, such as silicon nitride, may be formed underneath, over, and/or around sacrificial layer 200. Protective layers 202 may prevent diffusion of materials from sacrificial layer 200, such as Ti, into GaN LED epitaxial stack 231 during epitaxial GaN growth.

Figure 6:
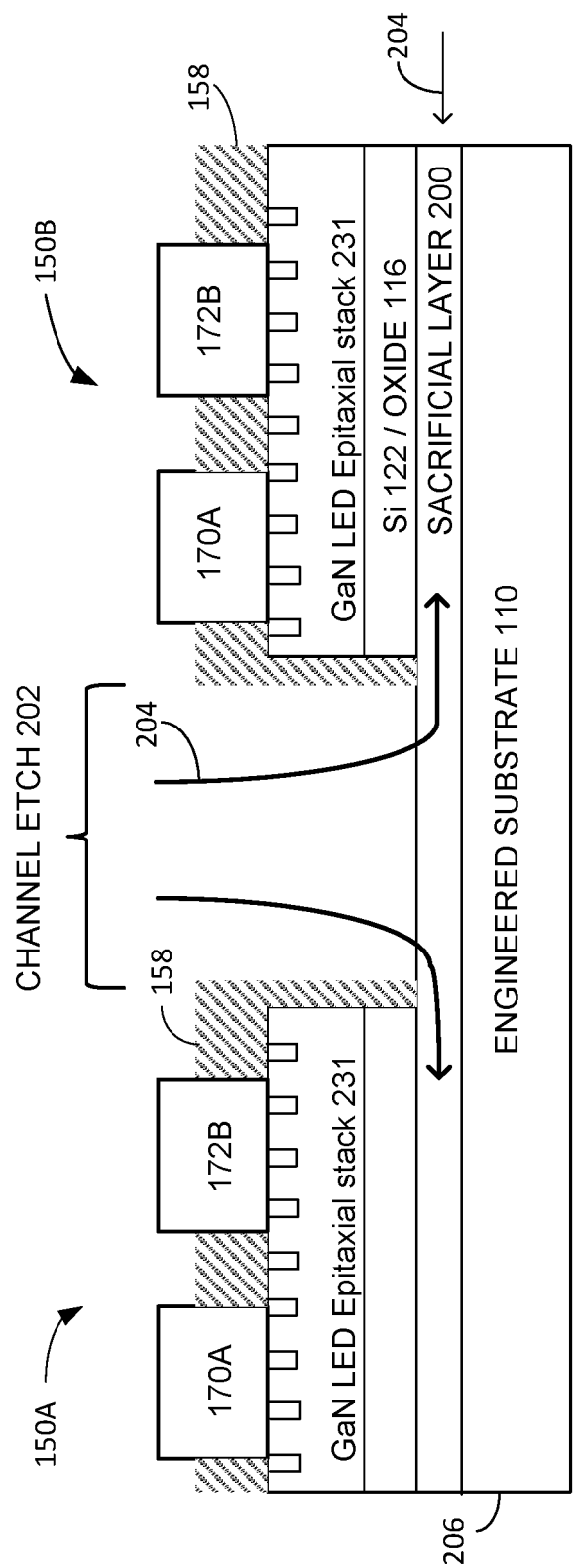
FIG. 6 shows an etched channel formed in a CSP device.

FIG. 6 shows another technique for reducing chemical separation time for removing an engineered substrate. LED devices 150A and 150B are formed on ES 110 as described above. As also described above, sacrificial layer 200 may comprise one of the existing engineered layers in ES 110. Alternatively, sacrificial layer 200 may comprise an additional designated engineered layer, such as titanium, formed in between or on top of other engineered layers within engineered substrate 110. The material used in the designated sacrificial layer is specifically selected be more receptive to chemical etching during the lift off process.

A channel 202 is etched though GaN LED epitaxial stack 231 and engineered layers down to sacrificial layer 200. In one example, channel 202 is substantially the same size and aligned with dies formed on the wafer surface that do not contain LED devices 150. The etching process also may extend around the perimeter sides of the wafer down to sacrificial layer 200. After channel etching is completed, a blocking mask is located over channel 202 prior to applying molding 158. The blocking mask prevents molding 158 from flowing into channel 202 and blocking access to sacrificial layer 200.

Chemical 204 is then applied through channel 202 and through the lateral sides 206 of the device wafer. Chemical 204 etches out sacrificial layer separating GaN LED epitaxial stack 231 from ES 110. Channel 202 increases the amount of surface area on sacrificial layer 200 immediately accessible by chemical 204 thus substantially reducing etching time during the separation process.

Figure 7:
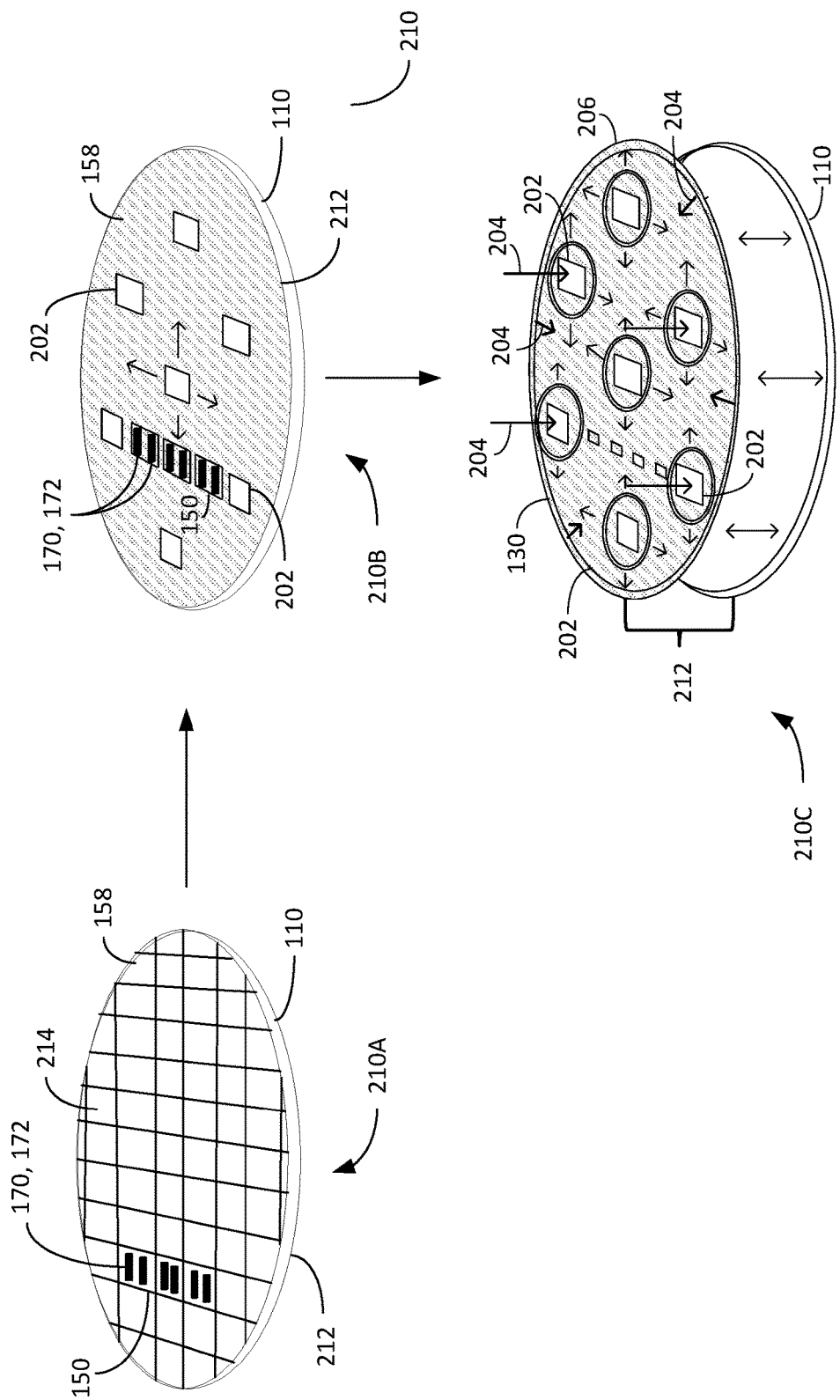
FIG. 7 shows chemical lift off operations for separating a GaN epitaxial layer from an engineered substrate.

FIG. 7 shows example chemical liftoff operations as described above. In operation 210A, chip scale package solid state LED devices 150 are formed on engineered substrate 110 of wafer 212. Each die 214 on wafer 212 may contain a separate LED device 150. As explained above each LED device 150 may have a pair of electrodes 170, 172.

In operation 210B, channels 202 are etched through GaN LED epitaxial stack 231, partially through the engineered layers, down to the sacrificial layer in engineered substrate 110. As mentioned above, channels 202 may be etched in empty die locations, around the perimeter of wafer 212, or at any other locations on wafer 212. A blocking mask is positioned over dies 214 and any other location containing channels 202. Molding 158 (shown in hatched lines) is applied around and/or over electrodes 170 and 172 of devices 150 while maintaining open access to channels 202.

In operation 210C, the lift off process applies chemical 204, such as strong acid like $H_2SO_4$ or HF, into channels 202 formed on wafer 212. Chemical 204 permeates down and radially out from channels 202 into the sacrificial layer. Chemical 204 also may etch radially inward into the sacrificial layer from channels 202 etched into the perimeter of wafer 212. With sufficient etching of the sacrificial layer, engineered substrate 110 separates from GaN LED epitaxial stack 231.

Figure 8:
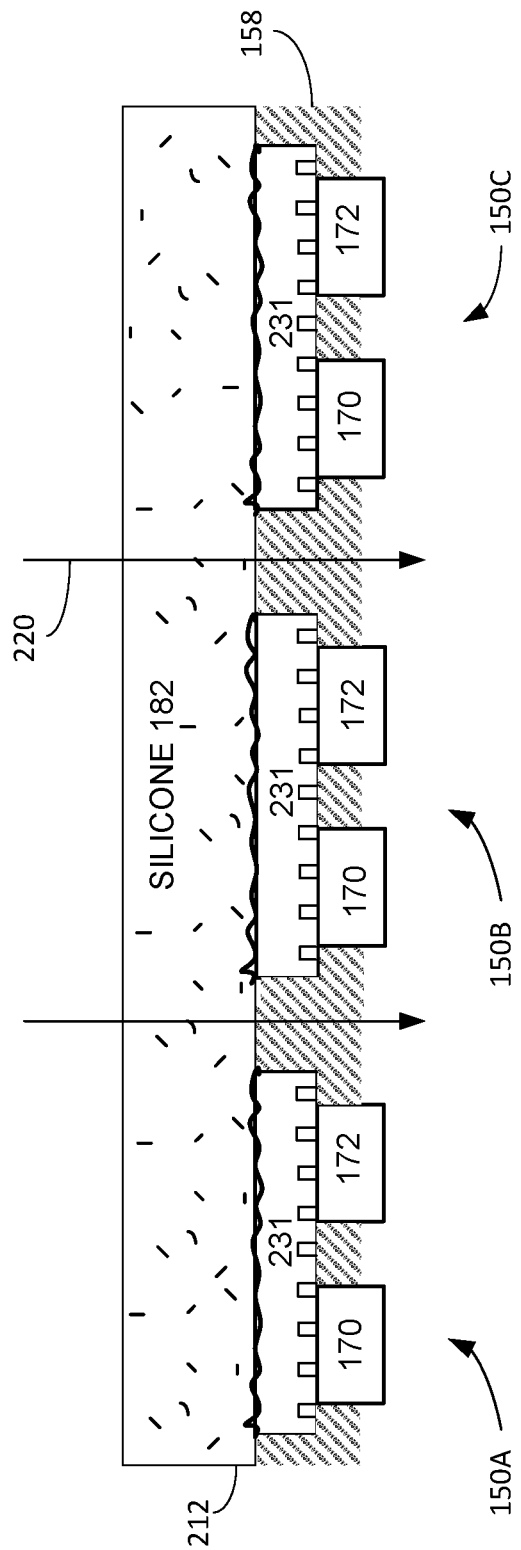
FIG. 8 shows a wafer containing multiple CSP devices after removal of an engineered substrate, and subsequent processing steps.

FIG. 8 shows GaN LED epitaxial stack 231 separated from the engineered substrate. The top surface of GaN LED epitaxial stack 231 is roughened and a combination of silicon 182 and phosphor is applied over the top. Wafer 212 is then diced 220 into separate chip scale package (CSP) solid state LED devices 150A-150C.

The process described above can be used for separating layers from any integrated circuit device using any type of substrate. For example, chemical separation may be used for wafer bond separation, wafer removal, layer transfer, and device layer stack and separation.

The example above describes a GaN LED device. However the chemical lift off process can be used with any integrated circuit (IC) device, such as multi junction GaN devices and high voltage GaN power devices. The chemical lift off process can also be applied to GaN devices that use nanowires, nanocolumns, or micro-emitters to output multiple wavelengths and provide white light. In another example, the lift off process may be performed without using the molding. In this case, temporary bonding might be used.

Figure 9:
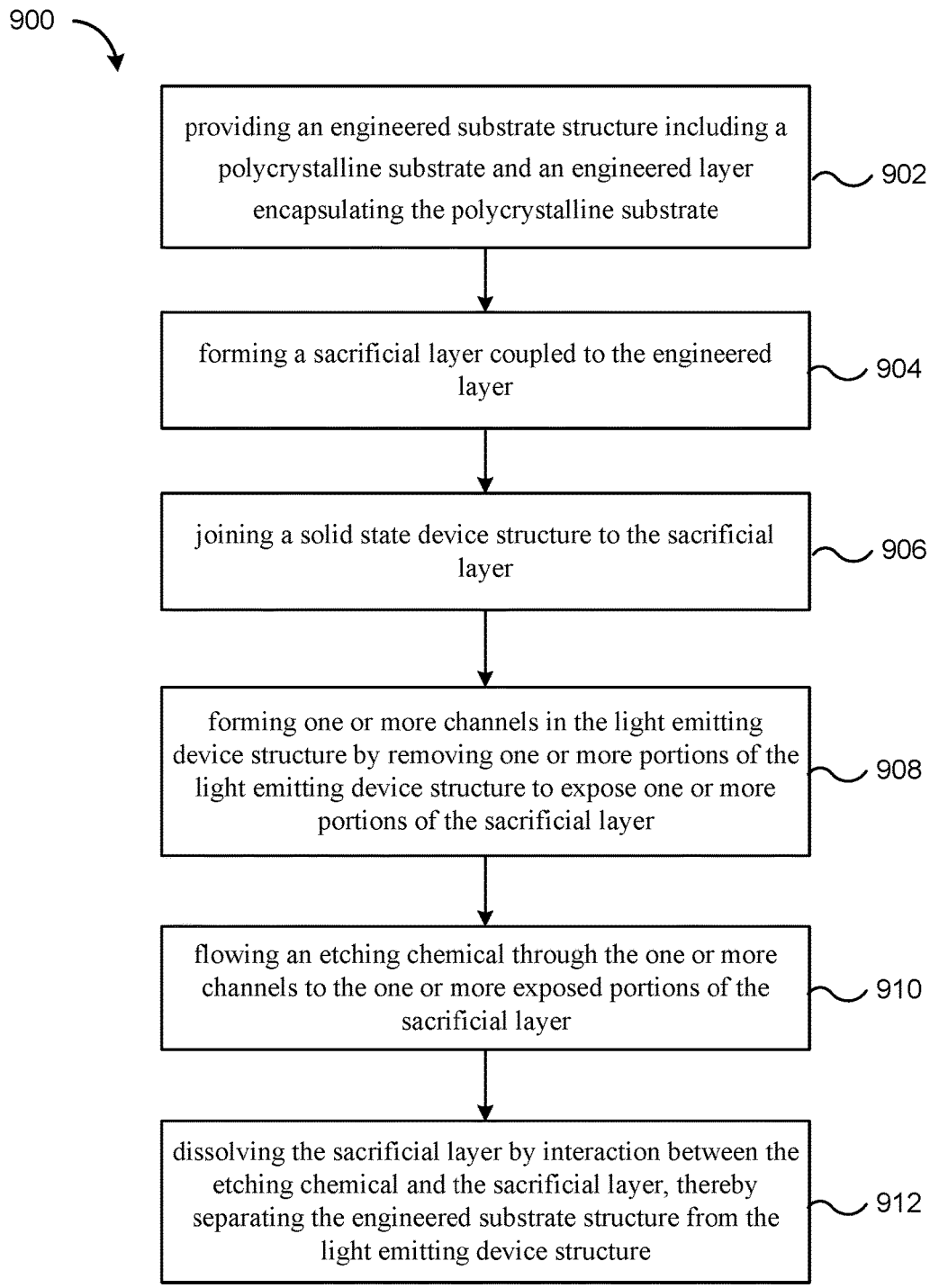
FIG. 9 shows a simplified flowchart illustrating a method of processing an engineered substrate structure according to an embodiment of the present invention.

FIG. 9 shows a simplified flowchart illustrating a method 900 of processing an engineered substrate structure according to an embodiment of the present invention. The method 900 includes, at 902, providing an engineered substrate structure. The engineered substrate may include a polycrystalline substrate and an engineered layer encapsulating the polycrystalline substrate. The method 900 further includes, at 904, forming a sacrificial layer coupled to the engineered layer; and at 906, joining a solid state device structure to the sacrificial layer. The method 900 further includes, at 908, forming one or more channels in the solid state device structure by removing one or more portions of the solid state device structure to expose one or more portions of the sacrificial layer; at 910, flowing an etching chemical through the one or more channels to the one or more exposed portions of the sacrificial layer; and, at 912, dissolving the sacrificial layer by interaction between the etching chemical and the sacrificial layer, thereby separating the engineered substrate structure from the solid state device structure.

It should be appreciated that the specific steps illustrated in FIG. 9 provide a particular method of processing an engineered substrate structure according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 10:
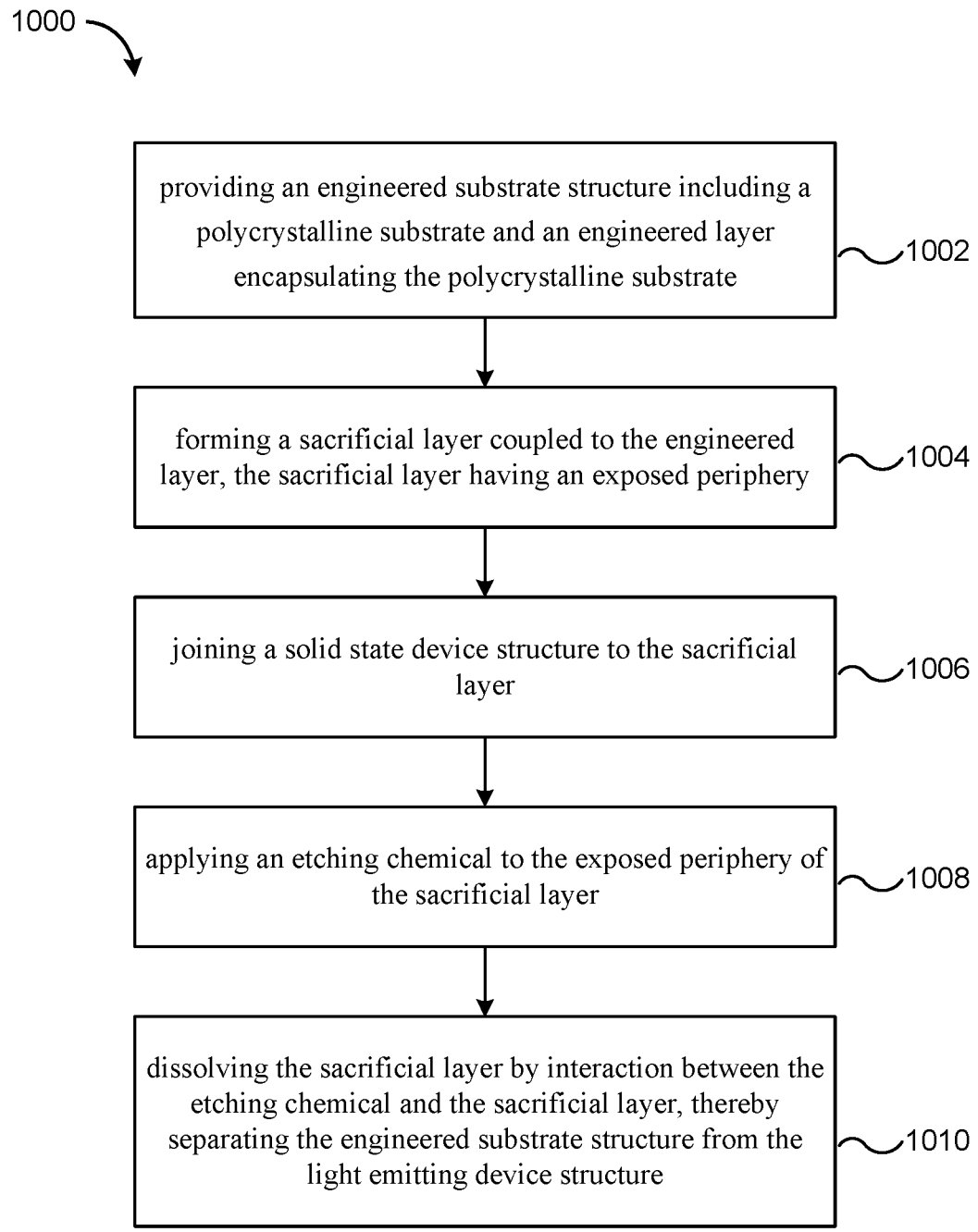
FIG. 10 shows a simplified flowchart illustrating a method of processing an engineered substrate structure according to another embodiment of the present invention.

FIG. 10 shows a simplified flowchart illustrating a method 1000 of processing an engineered substrate structure according to another embodiment of the present invention. The method 1000 includes, at 1002, providing an engineered substrate structure. The engineered substrate structure may include a polycrystalline substrate and an engineered layer encapsulating the polycrystalline substrate. The method 1000 further includes, at 1004, forming a sacrificial layer coupled to the engineered layer. The sacrificial layer has an exposed periphery. The method 1000 further includes, at 1006, joining a solid state device structure to the sacrificial layer; at 1008, applying an etching chemical to the exposed periphery of the sacrificial layer; and at 1010, dissolving the sacrificial layer by interaction between the etching chemical and the sacrificial layer, thereby separating the engineered substrate structure from the solid state device structure.

It should be appreciated that the specific steps illustrated in FIG. 10 provide a particular method of processing an engineered substrate structure according to an embodiment of the present invention. Other sequences of steps may also be performed according to alternative embodiments. For example, alternative embodiments of the present invention may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 11:
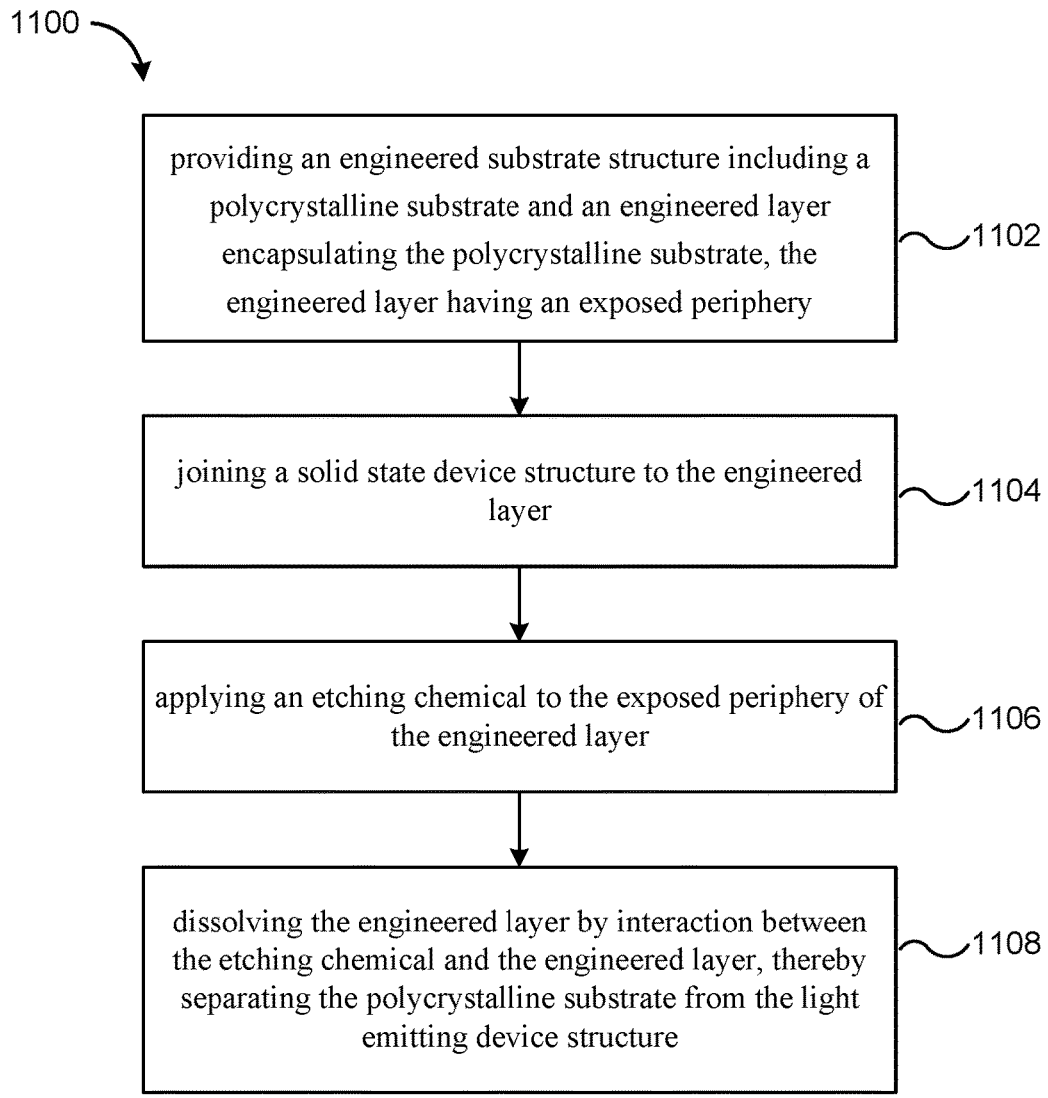
FIG. 11 shows a simplified flowchart illustrating a method of processing an engineered substrate structure according to a further embodiment of the present invention.

FIG. 11 shows a simplified flowchart illustrating a method 1100 of processing an engineered substrate structure according to a further embodiment of the present invention. The method 1100 includes, at 1102, providing an engineered substrate structure. The engineered substrate structure may include a polycrystalline substrate and an engineered layer encapsulating the polycrystalline substrate. The engineered layer has an exposed periphery. The method 1100 further includes, at 1104, joining a solid state device structure to the engineered layer; at 1106, applying an etching chemical to the exposed periphery of the engineered layer; and at 1108, dissolving the engineered layer by interaction between the etching chemical and the engineered layer, thereby separating the polycrystalline substrate from the solid state device structure.

It should be appreciated that the specific steps illustrated in FIG. 11 provide a particular method of processing an engineered substrate structure according to an embodiment of the present invention. Other sequences of steps may also be performed according to alternative embodiments. For example, alternative embodiments of the present invention may perform the steps outlined above in a different order. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of processing an engineered substrate structure, the method comprising:
   providing an engineered substrate structure including:
      a polycrystalline substrate; and
      an engineered layer encapsulating the polycrystalline substrate;
   forming a sacrificial layer coupled to the engineered layer;
   forming a solid state device structure coupled to the sacrificial layer;

forming one or more channels in the solid state device structure by removing one or more portions of the solid state device structure to expose one or more portions of the sacrificial layer;

after the one or more channels are formed, forming a molding support on the solid state device structure, the molding support exposing the one or more portions of the sacrificial layer;

after the molding support is formed, flowing an etching chemical through the one or more channels to the one or more portions of the sacrificial layer; and dissolving the sacrificial layer by interaction between the etching chemical and the sacrificial layer, thereby separating the engineered substrate structure from the solid state device structure.

2. The method of claim 1 wherein the sacrificial layer comprises one of titanium (Ti), vanadium (V), chromium (Cr), tantalum (Ta), tungsten (W), rhenium (Re), silicon oxide, silicon nitride, silicon oxinitride, or a combination thereof.

3. The method of claim 1 wherein the etching chemical comprises hydrofluoric acid (HF) or sulfuric acid ($H_2SO_4$).

4. The method of claim 1 wherein the polycrystalline substrate comprises one of polycrystalline aluminum gallium nitride (AlGaN), polycrystalline gallium nitride (GaN), polycrystalline aluminum nitride (AlN), silicon carbide (SiC), or a combination thereof.

5. The method of claim 4 wherein forming the solid state device structure comprises:
   forming a bonding layer coupled to the sacrificial layer;
   forming a substantially single crystalline silicon layer coupled to the bonding layer;
   forming a gallium nitride (GaN) layer coupled to the substantially single crystalline silicon layer; and
   forming one or more solid state devices coupled to the GaN layer.

6. The method of claim 5 wherein forming the GaN layer comprises epitaxially growing the GaN layer on the substantially single crystalline silicon layer.

7. The method of claim 6 wherein forming the one or more solid state devices comprises:
   forming an N—GaN layer coupled to the GaN layer by epitaxial growth;
   forming a GaN-based active layer coupled to the N—GaN layer by epitaxial growth; and
   forming a P—GaN layer coupled to the GaN-based active layer by epitaxial growth.

8. The method of claim 1 wherein the molding support covers sidewalls of the one or more channels.

9. A method of processing an engineered substrate structure, the method comprising:
   providing an engineered substrate structure including:
      a polycrystalline substrate; and
      an engineered layer encapsulating the polycrystalline substrate;
   forming a sacrificial layer coupled to the engineered layer, the sacrificial layer having an exposed periphery;
   forming a solid state device structure coupled to the sacrificial layer;
   forming a molding support on the solid state device structure;
   after the molding support is formed, applying an etching chemical to the exposed periphery of the sacrificial layer; and dissolving the sacrificial layer by interaction between the etching chemical and the sacrificial layer, thereby separating the engineered substrate structure from the solid state device structure.

10. The method of claim 9 wherein the sacrificial layer comprises one of titanium (Ti), vanadium (V), chromium (Cr), tantalum (Ta), tungsten (W), rhenium (Re), silicon oxide, silicon nitride, silicon oxinitride, or a combination thereof.

11. The method of claim 9 wherein the etching chemical comprises hydrofluoric acid (HF) or sulfuric acid ($H_2SO_4$).

12. The method of claim 9 wherein the polycrystalline substrate comprises one of polycrystalline aluminum gallium nitride (AlGaN), polycrystalline gallium nitride (GaN), polycrystalline aluminum nitride (AlN), silicon carbide (SiC), or a combination thereof.

13. The method of claim 9 wherein forming the solid state device structure comprises:
   forming a bonding layer coupled to the sacrificial layer;
   forming a substantially single crystalline silicon layer coupled to the bonding layer;
   forming a gallium nitride (GaN) layer coupled to the substantially single crystalline silicon layer; and
   forming one or more GaN-based devices coupled to the GaN layer.

14. A method of processing an engineered substrate structure, the method comprising:
   providing an engineered substrate structure including:
      a polycrystalline substrate; and
      an engineered layer encapsulating the polycrystalline substrate, the engineered layer having an exposed periphery;
   forming a solid state device structure coupled to the engineered layer;
   forming a molding support on the solid state device structure;
   after the molding support is formed, applying an etching chemical to the exposed periphery of the engineered layer; and
   dissolving the engineered layer by interaction between the etching chemical and the engineered layer, thereby separating the polycrystalline substrate from the solid state device structure.

15. The method of claim 14 wherein the etching chemical comprises hydrofluoric acid (HF) or sulfuric acid ($H_2SO_4$).

16. The method of claim 14 wherein the polycrystalline substrate comprises one of polycrystalline aluminum gallium nitride (AlGaN), polycrystalline gallium nitride (GaN), polycrystalline aluminum nitride (AlN), silicon carbide (SiC), or a combination thereof.

17. The method of claim 14 wherein the engineered layer comprises one of silicon oxide, silicon nitride, silicon oxinitride, or a combination thereof.

18. The method of claim 16 wherein forming the solid state device structure comprises:
   forming a bonding layer coupled to the engineered layer;
   forming a substantially single crystalline silicon layer coupled to the bonding layer;
   epitaxially growing a gallium nitride (GaN) layer coupled to the substantially single crystalline silicon layer; and
   forming one or more GaN-based devices coupled to the GaN layer by epitaxial growth of one or more GaN-based layers.

* * * * *